SEMICONDUCTOR DEVICES AND METHOD OF MAKING THE SAME

Filed Aug. 4, 1958

Arthur L. Wannlund Jr.,
INVENTOR.
BY.
Billy A. Robbins
ATTORNEY.

United States Patent Office 3,076,731

Patented Feb. 5, 1963

3,076,731

SEMICONDUCTOR DEVICES AND METHOD OF MAKING THE SAME

Arthur L. Wannlund, Jr., Rolling Hills, Calif., assignor to Hughes Aircraft Company, Culver City, Calif., a corporation of Delaware Filed Aug. 4, 1958, Ser. No. 752,985
6 Claims. (Cl. 148—1.5)

Figure 1:
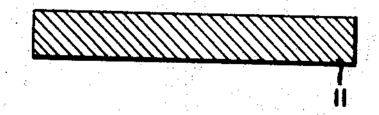

This invention relates to junction semiconductor devices and more particularly to a method of forming low resistivity regrown regions within a semiconductor crystal. The definitions of the terms active impurity, solvent metal, P-type and N-type regions and P-N junction may be found by reference to Patent No. 2,789,068, issued April 16, 1957, to J. Maserjian.

In the semiconductor art it often becomes desirable to have a low resistivity region within a semiconductor body and separated therefrom by a P-N junction. One application for such a device would be in a fused junction power diode, that is a diode capable of handling current in the order of 1 to 10 amperes. Such a low resistivity region would allow high forward conduction and at the same time low reverse current in the diode. Another example of devices in which low resistivity regions would be desirable is in junction transistors requiring a high injection efficiency emitter.

Various methods have been utilized in the prior art for producing such low resistivity regions within semiconductor bodies. One way of accomplishing this is to fuse or alloy a material with the semiconductor body which acts as an active impurity and which has a high numerical segregation coefficient therewith. Boron is such a material since it is an active impurity and has a segregation coefficient of approximately one with silicon semiconductor material. However, since boron melts at a relatively high temperature, approximately 2300° C., it would be impossible to alloy boron directly with silicon which melts at a temperature of 1420° C. without destroying the silicon semiconductor body. One method, therefore, for doping a silicon semiconductor crystal with boron which has been disclosed in the prior art, is to substantially saturate an aluminum pellet with boron and then alloy the pellet with at least a portion of the semiconductor body. While this method works exceedingly well and does succeed in producing boron doped regions within a semiconductor crystal, the percentage of boron which will go into the solution with aluminum is relatively low, on the order of about 2%. Therefore, where exceedingly low resistivity regions are desirable, this method has proven somewhat unsuccessful.

Another method which has been utilized is to evaporate aluminum-boron from a filament upon the surface of a semiconductor specimen. Most filaments which are used for carrying out this process, and especially tungsten, have an affinity for boron. The amount of boron, therefore, which reaches the semiconductor body is limited not only by that amount of boron which will go into solution with aluminum but also by that amount of boron which the filament absorbs during the evaporation step.

Accordingly, it is an object of the present invention to provide a method for producing low resistivity regions within a semiconductor crystal having a greater boron content than heretofore possible in the prior art.

Another object of the present invention is to provide a method for producing fused junction semiconductor devices having exceedingly low resistivity regions therein.

A further object of the present invention is to provide a method for producing fused junction semiconductor diodes capable of carrying large amounts of current.

Still another object of the present invention is to provide a method for producing fused junction semiconductor transistors having emitter P-N junction regions therein which exhibit greater injection efficiency than heretofore possible in the prior art.

It is still another object of the present invention to provide semiconductor diodes and transistors having exceedingly low resistivity regions therein.

The method of the present invention comprises preparing an alloy of boron and at least one metal having a relatively high numerical segregation coefficient with boron, placing at least a portion of said alloy upon a surface of a semiconductor body, heating the body and the alloy to a predetermined temperature, evaporating a layer of solvent metal upon at least a portion of said alloy and cooling the combination.

Figure 6:
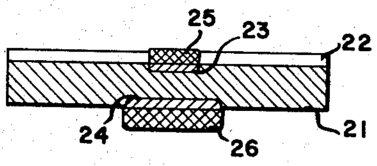

Other and more specific objects of this invention will be more fully understood by reference to the description taken in conjunction with the accompanying drawings, which are presented by way of example only, in which:

FIGS. 1–5 are schematic representations taken in cross section to illustrate a semiconductor body during various stages of production utilizing the method of the present invention, and FIG. 6 is a schematic representation taken in cross section of a fused junction transistor manufactured in accordance with one embodiment of the method of the present invention.

Referring now to the drawings and more particularly to FIGS. 1–5 thereof there is shown a semiconductor body 11. While the present invention is considered generic to all types of semiconductor material presently known to the art, the following description of the preferred embodiment of the present invention will be made with reference to silicon by way of example only. Semiconductor body 11 may be prepared in any of the manners presently well known to the art such as, for example, by zone melting or by drawing a crystal from a melt as in the Czochralski method of crystal production. While it is not always considered necessary, it is often times desirable that semiconductor crystal body 11 be single crystalline in nature. The semiconductor body 11 may be a portion of an ingot produced in accordance with the above methods and which is sliced therefrom. If a transistor is to be produced from the wafer 11, it is deemed desirable to orient the crystal so that the major surfaces thereof are aligned in the crystallographic 1-1-1 plane. Although such is deemed desirable, it is to be expressly understood that other crystallographic planes may also be utilized, such as the 1-1-0 and 1-0-0 planes. A boron alloy is next prepared by alloying boron with at least one metal in which boron is readily soluble, that is a metal having a high numerical segregation coefficient with boron. Examples of metals having a high segregation coefficient with boron are silicon, germanium and silicon-germanium alloy. The material which may be used in any given case is generally controlled by the material from which the semiconductor body is constructed and may include intermetallic materials as hereinabove discussed. It is generally considered desirable for purposes of the present invention that the metal with which boron is alloyed have a segregation coefficient with respect thereto in the range of .01 to 1. The segregation coefficient is defined as being the concentration of the material concerned in the solid solution ($C_s$) divided by the concentration of the material in the liquid solution ($C_l$). For purposes of description of the method of the present invention, silicon will be chosen as the material with which boron is alloyed and is not considered a limitation upon the scope of this invention. An ingot of the boron-silicon alloy may be prepared by mixing approximately 50 percent boron and approximately 50 percent silicon and placing the same in a crucible. The mixture is subjected to a temperature in the order of 1500° C. and is thereafter allowed to cool. The alloy may, of course, be prepared with any of the well known techniques for so doing, for example, by zone melting. After the alloy has been prepared at least a portion thereof is pulverized to take the form of small solid particles or powder. The pulverized alloy is then placed upon at least a portion of the surface of the semiconductor body 11 as shown at 12 in FIG. 2. A layer of material on the order of 5–10 mils thick has been found to operate satisfactorily, however, it should be emphasized that the thickness is not critical. Although it has been found that the silicon-boron alloy in the form of minute particles is desirable in many applications, it is to be expressly understood that the alloy may take any form convenient for a given consideration.

After the silicon-boron alloy is placed upon semiconductor body 11, the body is placed within an evaporation chamber; a chamber of the type shown in Patent No. 2,789,068 may be utilized for this purpose. The semiconductor body, along with the silicon-boron alloy, is heated to a temperature above the eutectic temperature of silicon, boron and a solvent metal which is to be evaporated thereon as more fully explained hereinafter. After the predetermined temperature is reached, a solvent metal is evaporated from a source shown schematically at 14 upon at least a portion of the surface of the silicon-boron alloy to form a layer as shown at 13 in FIG. 3. As an example, a layer of solvent metal approximately 5–10 mills thick has been found to work quite well. An example of solvent metals which may be utilized for purposes of the present invention are gold, silver, tin, aluminum and platinum. For purposes of the present invention, it will be assumed that the solvent metal utilized is aluminum. The semiconductor body and the silicon-boron alloy would, when aluminum is used as a solvent metal, be heated to a temperature between about 650° C. and 850° C., and it has been found that a temperature of about 800° C. works exceedingly well.

Figure 4:
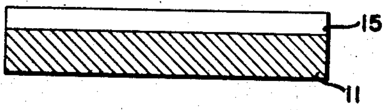
Figure 5:
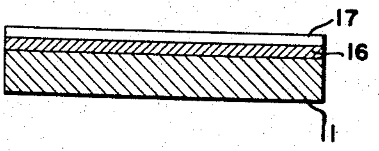

The molten aluminum which is evaporated upon the semiconductor body and silicon-boron alloy dissolves at least a portion of the silicon-boron alloy and a portion of the surface of semiconductor body 11, thus forming a molten solution of ternary eutetic material as shown at 15 in FIG. 4. Since boron has a high solubility in silicon (that is a segregation constant approximately equal to 1) and since silicon has a high solubility in aluminum, and since the melting point of the ternary eutectic is much less than the melting point of boron and silicon, a large number of boron atoms are carried into the molten solution 15.

Figure 2:
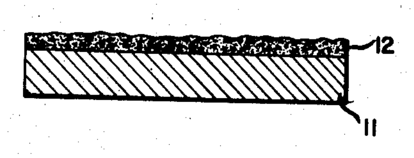
Figure 3:
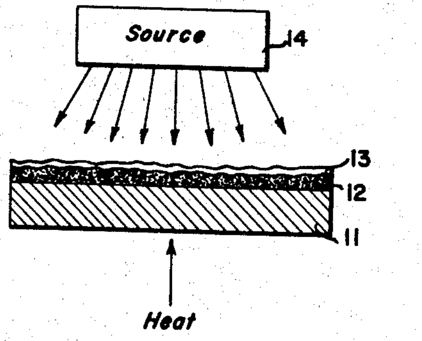

After the formation of the molten solution, heat is removed from the combination and it is allowed to cool at a predetermined rate. The rate of cooling is not critical and it was found that by merely removing the source of heat and allowing the combination to cool within the evaporation chamber at a rate of approximately 30° C. per minute, satisfactory results have been obtained. Upon cooling, a low resistivity region, as shown at 16 in FIG. 5, of silicon containing atoms of aluminum and boron as active impurity doping agents, is first precipitated from the molten solution. These atoms of material will grow upon and follow the crystallographic plane of parent crystal 11. Upon further cooling, a ternary alloy 17 will freeze out and will be attached electrically and physically to low resistivity region 16. The entire layer 17 is not necessarily, however, a eutectic alloy. This would result only if all of the boron-silicon alloy originally placed upon body 11, as shown in FIG. 2, where dissolved by the solvent metal evaporated thereon.

Leads may be atached to the alloy region 17 and to the parent crystal 11 at this stage by means well known to the art in order to form a silicon diode, assuming of course that crystal 11 is of N conductivity type; region 16, of course, being P conductivity type since both boron and aluminum are active impurities capable of converting a semiconductor crystal to P conductivity type. It should be understood that the method of the present invention may also be utilized to form ohmic connections to semiconductor crystal bodies.

While the above description has been concerned with the evaporation of aluminum as the solvent metal, it should again be pointed out that such metals as gold, silver, platinum and tin may also be used in lieu of aluminum. It is noteworthy that by use of the method of this invention P-N junctions may be formed by evaporating metals that are not active impurities. When metals such as gold, silver, platinum and tin are used as the solvent metal, a layer of material is provided on the semiconductor body to which lead attachment may be accomplished directly.

Although lead attachment to the layer 17 has been specified above, it should be understood that layer 17 may be removed and attachment made directly to converted region 16 if desired.

If it becomes desirable to produce a junction transistor, a junction may be formed in the opposite surface of semiconductor body 11 by carrying out the same steps as hereinabove described or by producing the junction in a manner such as that described in Patent No. 2,789,068, or otherwise, and thereafter connecting leads to the various portions of the semiconductor body in order to provide emitter, collector and base electrodes thereto.

As shown in FIG. 6, the low resistivity region may be produced within a semiconductor body by depositing the solvent metal upon only a predetermined portion of the alloy material placed upon the surface of a semiconductor crystal body such as 21. The steps as hereinabove set forth would remain substantially the same. The molten solvent metal would dissolve a portion of the alloy 22 and the semiconductor crystal body 21, thus providing a molten ternary eutectic solution. Upon cooling, a converted region 23, having an exceedingly low resistivity, would be formed and would have attached thereto eutectic alloy region 25. This would serve as a high injection efficiency emitter within a transistor for example. A collector P-N junction region may then be formed upon the opposite surface of crystal 21 by many of the methods well known to the art, thus providing a converted region 24 having a metallic alloy button 26 affixed thereto. Leads would then be attached to buttons 25 and 26 and to semiconductor body 21 to provide emitter, collector and base electrodes, respectively. The remaining portion of the alloy material 22 may be removed in any manner desirable, such as by brushing, etching or the like since there would be little or no contact between the alloy and semiconductor body 21.

By carrying out the method of the present invention as hereinabove described, regrown regions having a resistivity of the order of .002 ohm centimeters have been constructed. Regrown regions of this resistivity contain approximately $10^{20}$ atoms of active impurity per cubic centimeter which is much greater than has heretofore been possible.

There has thus been disclosed a method for producing very low resistivity regions within a semiconductor body which may be utilized as a high current diode or high injection efficiency emitter within a transistor. There has also been disclosed devices constructed in accordance with this method.

What is claimed is:

1. The method of producing a low resistivity region within a semiconductor body comprising the steps of: placing an alloy of boron and at least one metal having a relatively high numerical segregation coefficient with boron upon at least a portion of one surface of said semiconductor body, heating the combination to a predetermined temperature, evaporating a metal in which said alloy and said body are solvent upon at least a portion of said alloy, said predetermined temperature being at least the eutectic melting temperature of the ternary alloy of boron, said one metal, and said solvent metal, whereby a portion of said alloy and said body are dissolved by said solvent metal, and cooling the combination to form said low resistivity region.

2. The method of producing a low resistivity P-type region within a semiconductor body comprising the steps of: placing an alloy of boron and at least one metal having a segregation coefficient with boron of between approximately .01 and 1 upon at least a portion of one surface of said semiconductor body, heating the combination to a predetermined temperature, evaporating a metal in which said alloy and said body are solvent upon at least a portion of said alloy, said predetermined temperature being at least the eutectic melting temperature of the ternary alloy of boron, said one metal, and said solvent metal, whereby a portion of said alloy and said body are dissolved by said solvent metal, and cooling the combination to form said low resistivity region.

3. The method of producing a low resistivity P-type region within a semiconductor body comprising the steps of: preparing an alloy of boron and at least one metal having a relatively high numerical segregation coefficient with boron, placing at least a portion of said alloy upon at least a portion of one surface of said semiconductor body, heating the combination to a predetermined temperature, evaporating a metal in which said alloy and said body are solvent upon at least a portion of said alloy, said predetermined temperature being at least the eutectic melting temperature of the ternary alloy of boron, said one metal, and said solvent metal, whereby a portion of said alloy and said body are dissolved by said solvent metal, maintaining said temperature until a molten solution is produced which is at substantially thermodynamic equilibrium, and cooling the combination to form said low resistivity P-type region within said semiconductor body.

4. The method of producing a low resistivity P-type region within a silicon semiconductor body comprising the steps of: preparing an alloy of boron and silicon, placing at least a portion of said silicon-boron alloy upon at least a portion of one surface of said semiconductor body, heating the combination to a predetermined temperature, evaporating a metal in which silicon and boron are solvent upon at least a portion of said alloy, said predetermined temperature being at least the eutectic melting temperature of the ternary alloy of boron, silicon and said solvent metal whereby a portion of said alloy in said body is dissolved, and cooling the combination at a predetermined rate to form said low resistivity P-type region within said semiconductor body.

5. The method of producing a low resistivity P-type region within a silicon semiconductor body comprising the steps of: preparing an alloy of boron and silicon, placing at least a portion of said silicon-boron alloy upon at least a portion of one surface of said semiconductor body, heating the combination to a predetermined temperature, evaporating aluminum upon at least a portion of said silicon-boron alloy, said predetermined temperature being at least the eutectic melting temperature of the ternary alloy of silicon-boron-aluminum, whereby at least a portion of said silicon-boron alloy and said silicon semiconductor body are dissolved, and cooling the combination to form said low resistivity region.

6. The method of producing a low resistivity P-type regrown region within an N-type silicon semiconductor body comprising the steps of: preparing an alloy of boron and silicon containing between approximately 5 percent and 50 percent boron, the remainder being silicon; pulverizing said alloy to produce small particles thereof; placing a layer of said particles upon at least a portion of one surface of said semiconductor body; heating said semiconductor body and said alloy to a temperature between 650° C. and 850° C.; evaporating a layer of molten aluminum upon said alloy, whereby said molten aluminum dissolves at least a portion of said alloy and at least a portion of said surface of said semiconductor body to form a eutectic solution of aluminum-boron-silicon; cooling the combination to form an aluminum-boron doped P-type region adjacent said silicon body and separated therefrom by a P-N junction; and further cooling the combination to form an alloy containing aluminum-boron-silicon electrically and mechanically affixed to said converted region.

References Cited in the file of this patent

UNITED STATES PATENTS

| | | |
|---|---|---|
| 2,829,999 | Gudmundsen | Apr. 8, 1958 |
| 2,833,678 | Armstrong | May 6, 1958 |
| 2,870,052 | Rittmann | Jan. 20, 1959 |
| 2,986,481 | Gudmundsen | May 30, 1961 |